(12) United States Patent
Xiao et al.

(10) Patent No.: US 9,472,891 B2
(45) Date of Patent: Oct. 18, 2016

(54) SIGNAL TRANSMISSION MODULE WITH RELIABLE SEALING STRUCTURE

(71) Applicant: FOXCONN INTERCONNECT TECHNOLOGY LIMITED, Grand Cayman (KY)

(72) Inventors: Xue-Yuan Xiao, Kunshan (CN);
Jia-Wei Gu, Kunshan (CN);
Zhang-Lan Xue, Kunshan (CN);
Zi-Qiang Zhu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/675,605

(22) Filed: Mar. 31, 2015

(65) Prior Publication Data
US 2015/0280353 A1    Oct. 1, 2015

(30) Foreign Application Priority Data

Mar. 31, 2014  (CN) ...................... 2014 1 0124419 A

(51) Int. Cl.

| H01R 13/52 | (2006.01) |
|---|---|
| H01R 13/46 | (2006.01) |
| H01R 13/6581 | (2011.01) |
| H01R 24/60 | (2011.01) |
| H01R 13/405 | (2006.01) |
| H05K 5/06 | (2006.01) |
| H05K 5/00 | (2006.01) |
| H01R 107/00 | (2006.01) |
| H01R 12/72 | (2011.01) |

(52) U.S. Cl.
CPC .......... *H01R 13/521* (2013.01); *H01R 13/405* (2013.01); *H01R 13/46* (2013.01); *H01R 13/6581* (2013.01); *H01R 24/60* (2013.01); *H05K 5/0069* (2013.01); *H05K 5/06* (2013.01); *H01R 12/724* (2013.01); *H01R 12/727* (2013.01); *H01R 2107/00* (2013.01)

(58) Field of Classification Search
CPC .......... H01R 13/5216; H01R 13/5208; H01R 13/5205; H01R 13/521; H01R 4/70
See application file for complete search history.

(56) References Cited

U.S. PATENT DOCUMENTS

| 5,447,446 | A | * | 9/1995 | Miller | .................. | H01R 43/005 |
|---|---|---|---|---|---|---|
| | | | | | | 439/281 |
| 6,926,540 | B1 | * | 8/2005 | Juntwait | .............. | H01R 12/585 |
| | | | | | | 439/276 |
| 2013/0242475 | A1 | * | 9/2013 | Sloey | ................. | H01R 13/5202 |
| | | | | | | 361/679.01 |
| 2013/0344736 | A1 | * | 12/2013 | Latunski | .............. | H01R 13/521 |
| | | | | | | 439/587 |

FOREIGN PATENT DOCUMENTS

| CN | 100377436 C | 8/2005 |
|---|---|---|
| CN | 203521710 U | 4/2014 |

* cited by examiner

*Primary Examiner* — Gary Paumen
(74) *Attorney, Agent, or Firm* — Wei Te Chung; Ming Chieh Chang

(57) ABSTRACT

A signal transmission module includes a shell and a connector. The shell includes a box and a mating portion. The connector includes an insulative housing received in the box and a set of contacts. Each contact includes a middle portion, a contacting portion extending into the mating portion and a tail portion. A gap is formed between the insulative housing and the box for sealant being injected. The signal transmission module further includes a horizontal channel located between the insulative housing and the box for the sealant entering into and a vertical channel connecting the horizontal channel.

19 Claims, 7 Drawing Sheets

SIGNAL TRANSMISSION MODULE WITH RELIABLE SEALING STRUCTURE

BACKGROUND OF THE INVENTION

1. Field of the Invention

The present invention relates to a signal transmission module, more particularly to a signal transmission module with reliable sealing structure.

2. Description of Related Art

China Patent No. CN100377436C, published on Mar. 26, 2008, discloses a similar signal transmission module, and the signal transmission module includes a shell, an electrical connector received in the shell, a print circuit board mated in the shell for an electrical contact with the electrical connector, and a module cover assembled above the shell for protecting the print circuit board. The shell defines a groove, and while the electrical connector is received in the groove, a mixture or sealant would be irrigated into a gap between the electrical connector and the shell for sealing up the connector.

However, the connector has an insulative housing and a plurality of contacts, and the contacts are retained in the insulative housing and pass through the gap into the shell. When the mixture or sealant is irrigated from the top of the gap by the gravity for filling the gap, the contacts retained in the gap would block the flowing, and it makes the mixture or sealant wrap bubbles and which would result in a bad seal. And the time the irrigation cost takes more.

Hence, an improved signal module assembly is required to overcome the disadvantages of the related art.

BRIEF SUMMARY OF THE INVENTION

Accordingly, the object of the present invention is to provide a signal transmission module assembly with a reliable sealing.

In order to achieve the object reminded above, a signal transmission module includes a shell and a connector received in the shell. The shell includes a box and a mating portion protrudes forward from the box. The connector includes an insulative housing extending in left-to-right direction and a set of contacts retaining in the insulative housing. Each contact includes a middle portion retained in the insulative housing, an engaging portion extending forwardly and passing through the box into the mating portion, and a tail portion extending upwardly and protruding out of the insulative housing. A gap is formed between the insulative housing and the box for sealant entering into. The signal transmission module further includes a horizontal channel located between the insulative housing and the box for the sealant entering into and a vertical channel connecting the horizontal channel.

In order to achieve the object reminded above, another signal transmission module is provided and it includes a shell and a connector received in the shell. The shell includes a box and a mating portion protruding forwardly from the box. The box includes a bottom wall, a front wall and a rear wall extending upwardly from respective front and rear edges of the bottom wall, a pair of sidewalls extending upwardly from respective left and right edges of the bottom wall, and a receiving cavity formed by the bottom wall, the front wall, the rear wall and the sidewalls. The connector includes an insulative housing fixing in the front wall and received in the receiving cavity and a set of contacts. Each contact includes a middle portion retained in the insulative housing, an engaging portion extending forwardly and passing through the box into the mating portion, and a tail portion extending upwardly and protruding out of the insulative housing. A gap is formed between the insulative housing and the box for sealant entering into. The signal transmission module further includes a horizontal channel located between the insulative housing and the box for the sealant entering into and a vertical channel connecting the horizontal channel. The horizontal channel locates at the bottom of the gap and communicates the gap along the front-to-back direction.

According to the present invention, the signal transmission module defines a horizontal channel located at the bottom of the gap for the sealant entering into and a vertical channel connecting the horizontal channel for a tool injecting the sealant into the horizontal channel directly. Furthermore, the sealant would fill the gap from the bottom to the top of the gap. By this way, the sealant would not wrap any bubbles, which makes a more realizable seal and a faster sealant-injection speed.

Other objects, advantages and novel features of the invention will become more apparent from the following detailed description when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
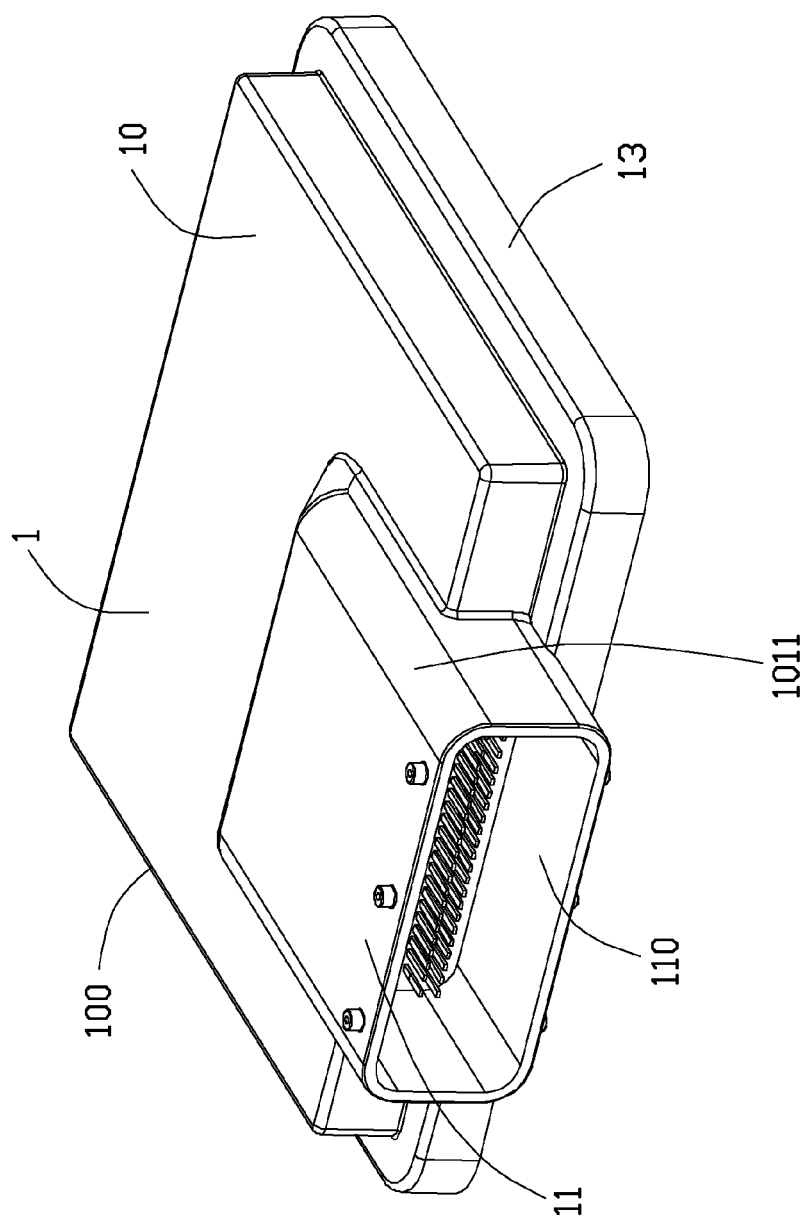
FIG. 1 is a partly perspective view of a signal transmission module according to the present invention.

Reference will be made to the drawing figures to describe the present invention in detail, wherein depicted elements are not necessarily shown to scale and wherein like or similar elements are designated by same or similar reference numeral through the several views and same or similar terminology.

According to the present invention, a signal transmission module is provided which could be used in vehicles for a signal transmission. Referring to FIGS. 1-4, the present aspect of the invention shows a signal transmission module 100 including a shell 1 and a connector 2 assembled in the shell 1. Besides, the transmission module 100 further includes a print circuit board (not shown in the figures) mating in the shell 1 for an electrically contact with the connector 2 and a shell cover (not shown in the figures) assembled above the shell 1 for protecting the print circuit board. But the print circuit board and the shell cover are not shown in appended figures and not described in detail for less relevant to the substance of the present invention.

Referring to FIGS. 1-4, the shell 1 includes a box 10, a receiving cavity 12 circled by the box 10 and a mating portion 11 protruding forward from the box 10. The box 10 includes a bottom wall 101, a front wall 102 and a rear wall 103 extending upwardly from respective front and rear edges of the bottom wall 101 and a pair of sidewalls 104 extending upwardly from respective left and right edges of the bottom wall 101. The receiving cavity 12 is surrounded by the bottom wall 101, the front wall 102, the rear wall 103 and the sidewalls 104. The front and the rear wall 102, 103 and the sidewalls 104 further protrudes upwardly respectively and forms a protrude edge 13. The bottom wall 101 protrudes downwardly near the front wall 102 and forms a convex 1011. The convex 1011 defines a groove 121 and the groove 121 is a part of the receiving cavity 12.

The mating portion 11 protrudes forwardly from the front wall 102 of the box 10 and forms a mating space 110. A U-shaped slot 1021 is defined in the inner/rear surface of the front wall 102 and communicates the groove 121 of the receiving cavity 12, and the front wall 102 defines a set of terminal slots 1020 therethrough which communicate the mating space 110 and the U-shaped slot 1021 along the front-to-back direction wherein the terminal slots 1020 are arranged with a matrix zone around said gap 1021. The U-shaped slot 1021 opens upwardly, and an inner surface of the front wall 102 recesses in the top of the U-shaped slot 1021 and forms an opening 1022. The front wall 102 defines a first arc-shaped passageway 1024 beside the U-shaped slot 1021 and communicating therewith. The terminal slots 1020 are arranged in rows and columns along the vertical direction and the horizontal direction respectively. The front wall 102 defines several recesses/slits 1023 between every two adjacent columns of the terminal slots 1020 along the vertical direction. The convex 1011 of bottom wall 101 has a pair of locking blocks 1012 protruding into the groove 121, a pair of ribs 1013 locating on both sides of the groove 121 and protruding into the groove 121, and a pair of elastic stoppers 1014 standing in both side of the groove 12. Preferably, the stoppers 1014 define several guarding inclines for guarding the connector 2 into the box 10.

The shell 1 is made from plastic materials, and a metal coating is sprayed in the inner surface of the shell 1 for an EMI (Electro Magnetic Interference) shielding. In other aspects of the invention, the metal coating also can be instead of a stamping-formed metal shell.

Figure 2:
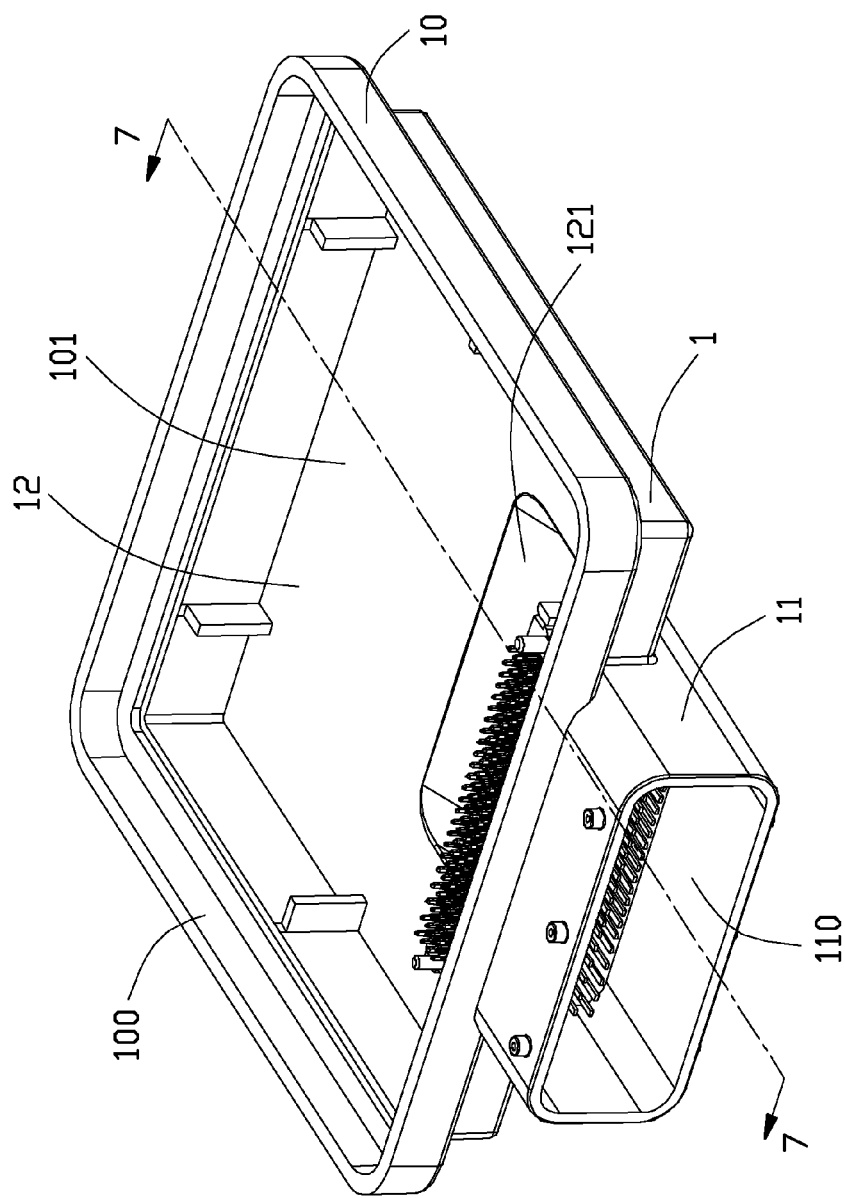
FIG. 2 is a perspective view in another direction of the signal transmission module shown in FIG. 1.
Figure 3:
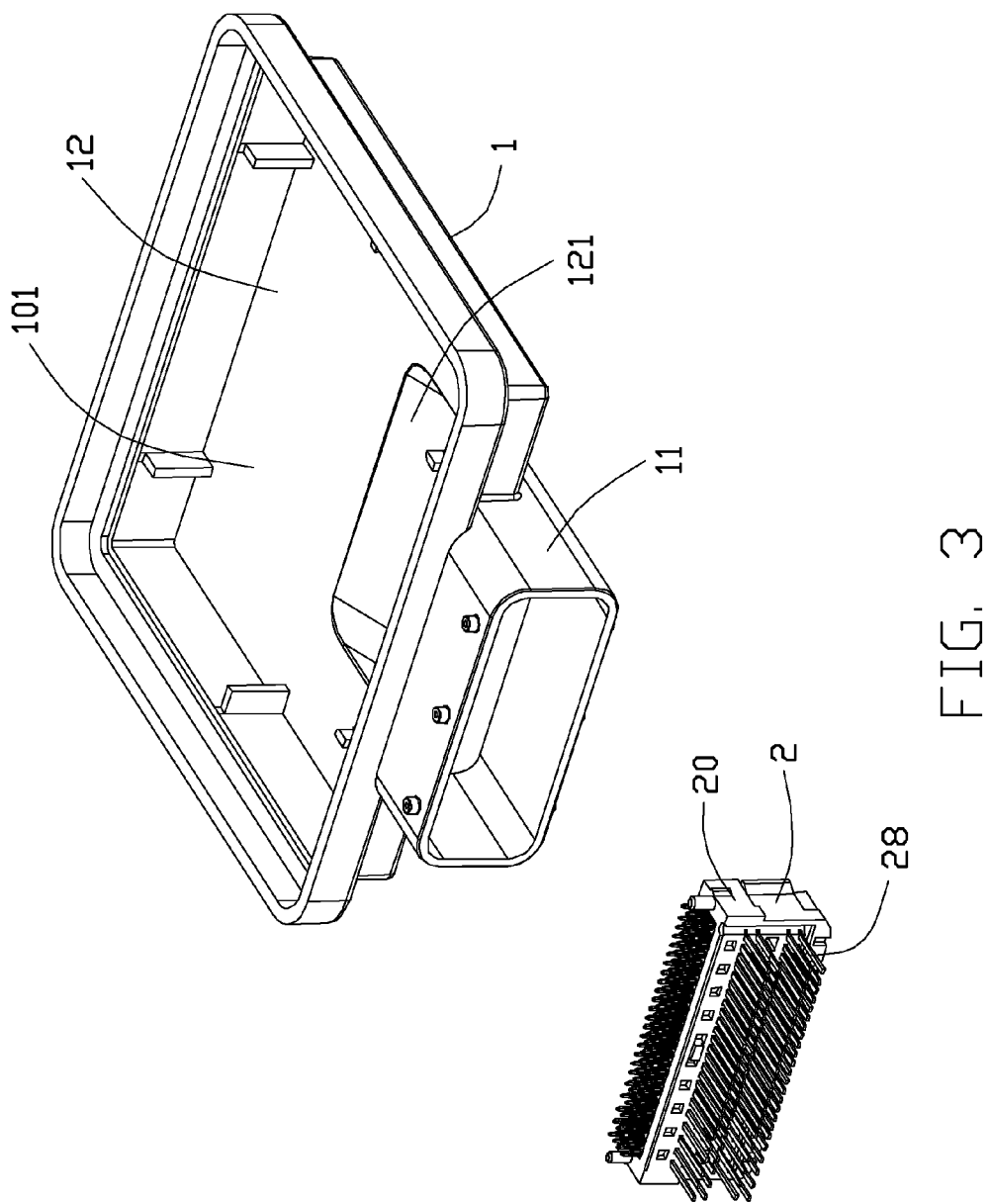
FIG. 3 is a partly exploded view of the signal transmission module shown in FIG. 2.
Figure 4:
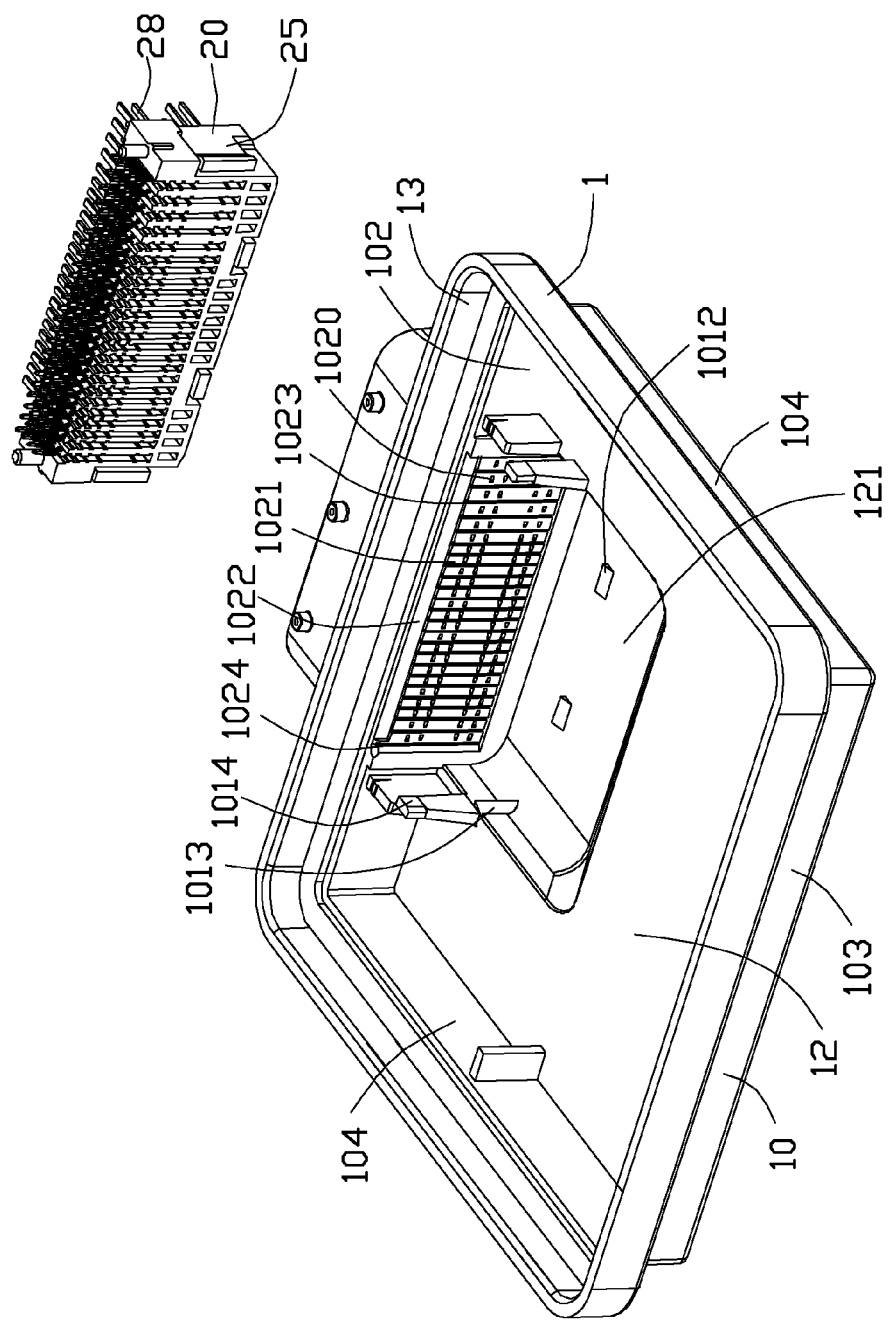
FIG. 4 is a perspective view in another direction of the signal transmission module shown in FIG. 3.
Figure 5:
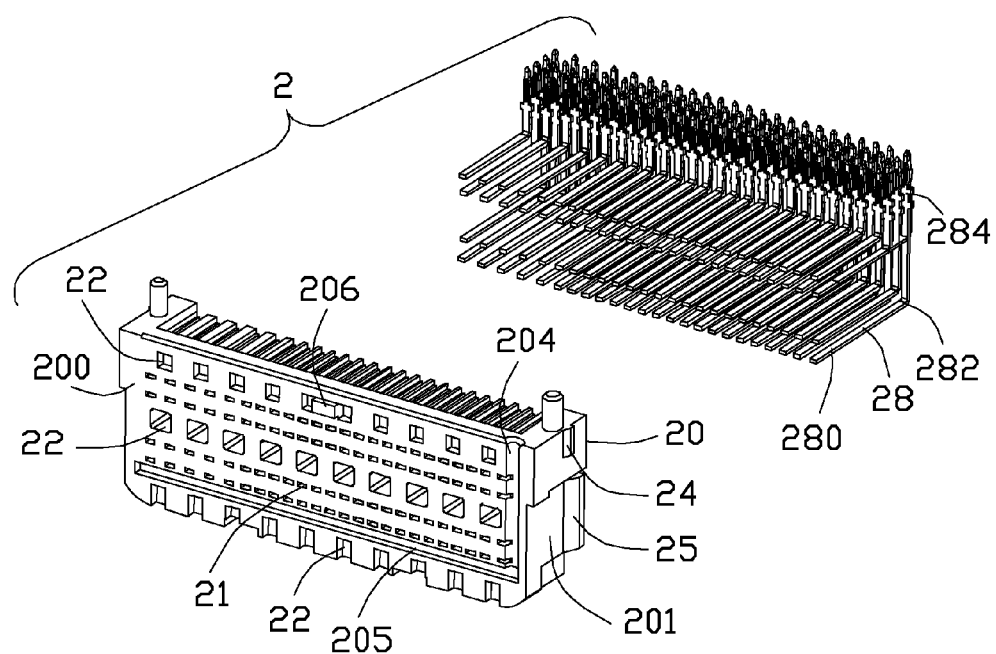
FIG. 5 is an exploded view of the connector of the signal transmission module according to the present invention.
Figure 6:
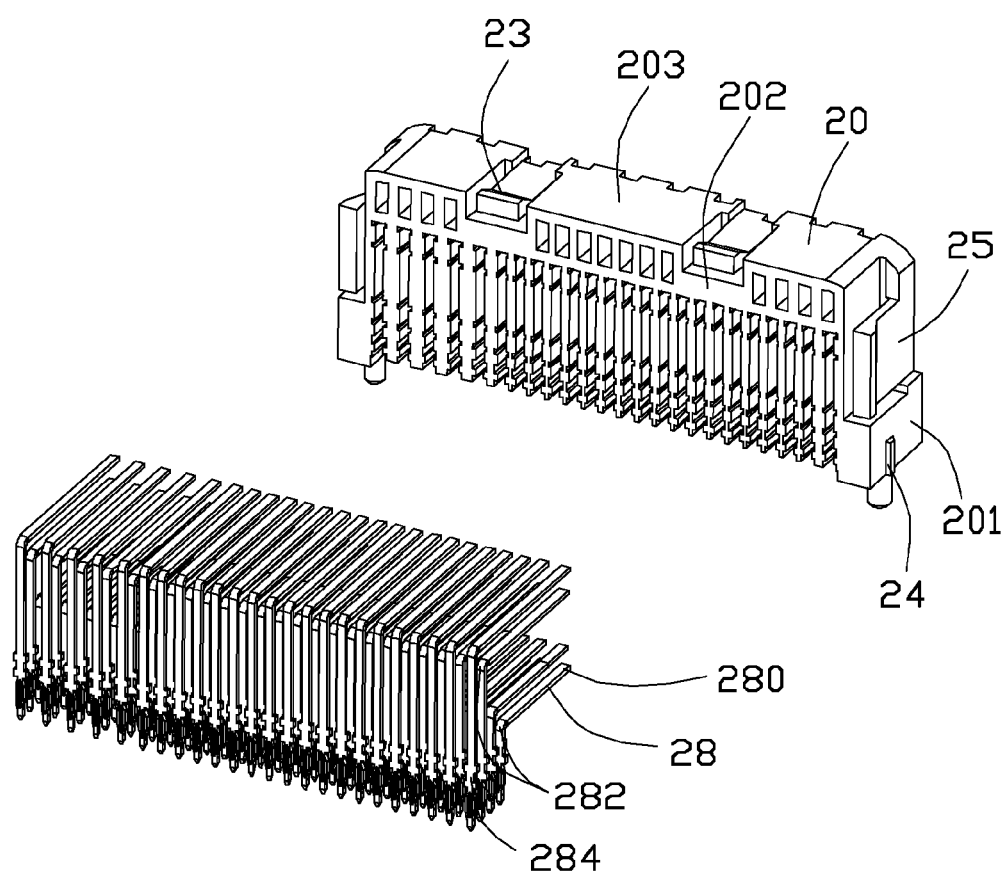
FIG. 6 is an exploded view in another direction of the connector shown in FIG. 5.

Referring to FIGS. 5-6, the connector 2 is inverted-mated in the shell 1. The connector 2 includes an insulative housing 20 and a set of contacts 28 retaining in the insulative housing 20. The insulative housing 20 is longitudinal and includes a front surface 200, a rear surface 202 opposite to the front one, two side surfaces 201 in both sides of the connector 2, and a top surface 203 connecting the front and the rear ones. For a convenient description, here we define the top surface 203 locating in the bottom of the insulative housing 20 as shown in FIGS. 2-4. The insulative housing 20 arranges two rows of receiving slots 21 passing through the front and the rear surfaces, and the insulative housing 20 defines three rows of recesses 22 recessing on the front surface 200 are respectively disposed above and between and below the two rows of receiving slots 21, which are for preventing the insulative housing 20 from bending and deforming caused by temperature changing during testing or using.

On the front surface 200 of the insulative housing 20 further defines a second passageway 204 extending along the vertical direction and a third passageway 205 extending along the horizontal direction. Furthermore, the second passageway 204 is located at one side of the front surface 200 and the third passageway 205 is set on the bottom of the front surface 200 beyond the receiving slots 21. The insulative housing 20 also comprises a tuber 206 disposed at the upper of the front surface 200 and extending forwardly therefrom, a pair of first elastic arms 23 disposed on the top surface 203 and extending backwardly therefrom. The insulative housing 20 further defines a pair of bulges 24 in the upper of the side surfaces 201 and a pair of second elastic arms 25 respectively disposed beyond the bulges 24 and extending backwardly from the side surfaces 201.

Each contact 28 includes an engaging portion 280 extending forwardly from the front surface 200 of the insulative housing 20 and passing through the corresponding terminal slots 1020 of the front wall 102, a right-angled connecting portion 282 extending from the engaging portion 280 and retained in the corresponding receiving slots 21 for retaining the contact 28 in the insulative housing 20, and a tail portion 284 extending upwardly from the connecting portion 282 and protruding out of the insulative housing 20. The diameter of the plated through hole is bigger than the width of the end of the tail portion 284 and smaller than at least one part of the tail portion 284.

It is understood that the contacts 28 can also be insert molded with the insulative housing 20.

Referring to FIGS. 1-7, when the connector 2 is placed into the box 10 from backward to forward, the stoppers 1014 of the box 10 are pressed forwardly and deformed away from each other by the bulges 24 on the side surfaces 201 of the insulative housing 20, and meanwhile, the first elastic arms 23 on the top surface 203 and the second elastic arms 25 on the side surfaces 201 deform under the pressure providing by the first locking blocks 1012 and the second locking blocks 1013 of the box 10 respectively. So that, the insulative housing 20 is easy to be received in the groove 121 of the box 10. The engaging portions 280 of the contacts 28 pass through the terminal slots 1020 and extend into the mating space 110 of the mating portion 11 for engaging with a mating device.

After the connector 2 is mated in the receiving cavity 12 of the shell 1, the tuber 206 of the insulative housing 20 protrudes into the U-shaped slot 1021 and abuts against the front wall 102 so as to prevent the connector 2 from deforming forwardly under its inner strain, and the two stoppers 1014 of the box 10 abut on the two bulges 24 of the insulative housing 20 so as to prevent the connector 2 from deforming backwardly under its inner strain. Wherein the inner strain results from environmental temperature's changing when the connector 2 is in use or in test. Furthermore, the first locking blocks 1012 and the second locking blocks 1013 of the box 10 respectively abut against the first elastic arms 23 on the top surface 203 of the insulative housing 20 and the second elastic arms 25 on the side surfaces 201 of the insulative housing 20, which makes the connector 2 to be fixed better, but also prevents the top surface 203 (which is beneath the insulative housing 20) and the middle parts of the side surfaces 201 from deforming backwardly. In other aspects of the present invention, it's understood that the tuber 206 can also be integrated molding with the front wall 102 of the box 10.

For a U-shaped slot 1021 is defined in the front wall 102, a gap is formed between the front surface 200 of the insulative housing 20 and the inner surface of the front wall 102 of the box 10 for entering sealant 5 into when the connector 2 is mated. Optionally the U-shaped gap 1021 can also be defined on the front surface 200 of the insulative housing 20. The first passageway 1024 and the second passageway 204 combine into a vertical channel communicating with the said third passageway 205, and both the vertical channel and the third passageway 205 are communicating with the U-shaped slot (gap) 1021 along the front-to-back direction, and the bottom surface of the third passageway 205 is below the bottom surface of the U-shaped slot 1021. As a result, the U-shaped slot 1021, at one side thereof communicating with the vertical channel, at the bottom thereof communicating with the third passageway 205. It's understood that, in other aspects of the present invention, the bottom surface of the third passageway 205 can be in alignment with the bottom surface of the U-shaped slot 1021. In order to enter the sealant 5 into the gap, a needlelike injector tool with an injection hole is used to insert into the vertical channel until said injection hole reaching the third passageway 205. Subsequently, the sealant 5 directly flows into the third passageway 205 by the injection hole, so that the sealant would not wrap any bubbles, which makes a more realizable seal. And the passageway 205 makes the sealant 5 quickly full the U-shaped gap 1021 from left to right and it speeds up injecting process for a low cost. The constructions like the insulative housing 20 and the box 10 defining said tuber 206 and said stopper 1014, et al. assure that said housing 20 will not bend or deform so as to assure the gap between the insulative housing 20 and the front wall 102 will not change and further assure the sealant 5 of providing a reliable seal.

In this present aspect of the invention, the first passageway 1024 and the second passageway 204 combine into the vertical channel while the third passageway 205 is defined on the insulative housing 20 independently. Optionally said third passageway 205 can also be defined on the front wall 102 of the box 10 alone or divide into two parts respectively disposed on the front wall 102 of the box 10 and the insulative housing 20. Furthermore, it is optional for said vertical channel to be combined with two parts or an independent one on the front wall 102 or the insulative housing 20. That is to say, as long as said third passageway 205 forms between said front surface 200 of the insulative housing 20 and the front wall 102 of the box 10, and said third passageway 205 communicates with the bottom of said U-shaped slot 1021 and said vertical channel, and said vertical channel enables the needlelike injecting tool to reach said third passageway 205, and the sealant 5 could be injected into the third passageway 205, one objective of this invention is achieved. Furthermore, in other embodiment, the vertical channel can also be disposed in middle of said third passageway 205, and said vertical channel or said third passageway 205 can also be inclined to facilitate the sealant 5 flowing. Furthermore, the opening 1022 on the top of the U-shaped gap 1021 is convenient to watch how the sealant 5 is entered and prevents the sealant 5 from spilling out of the U-shaped gap 1021 by receiving more sealant 5 when the U-shaped gap 1021 is going to be full. And it will be appreciated that more sealant 5 further increases the reliability of seal.

Figure 7:
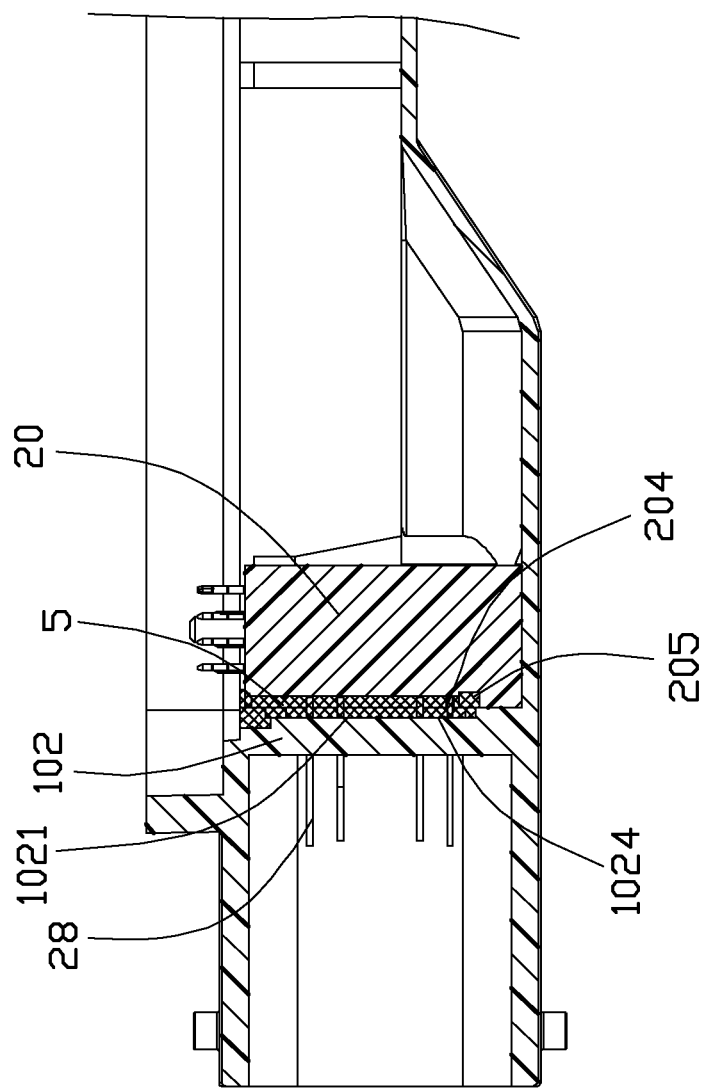
FIG. 7 is a cross-sectional view of the signal transmission module taken along the line 7-7 shown in FIG. 2.

There are a plurality of recesses 1023, each of which defined between every two columns of the terminal slots 1020 and extended along the vertical direction. When the sealant 5 enters into the U-shaped slot 1021, the sealant 5 fills the recesses 1023, which further increases the bond strength between the sealant 5 and the front wall 102 of the box 10. Optionally, each of the recesses 1023 can also be defined between every two rows of the terminal slots 1020 and extending along the horizontal direction. Furthermore, the recesses 1023 can also be defined on the front surface 200 of the insulative housing 20. Notably, as shown in FIG. 7, the sealant 5 fills the opening 1022, the gap 1021, and the third passageway 205 so as to form a Z like configuration in the cross-sectional view. On the other hand, from another aspect the first passageway 2014, the third passageway 205 and the second passageway 204 essentially commonly form a U-shaped configuration to surround the gap 1021 so as to assure completeness of the filling sealant 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A signal transmission module comprising:
a shell including a box and a mating portion protrudes forwardly from the box; and
a connector including an longitudinal insulative housing extending in a left-to-right direction and a set of contacts retained in the insulative housing, each of the contacts including a middle portion retained in the insulative housing, an engaging portion extending forwardly and passing through the box into the mating portion, and a tail portion extending upwardly and protruding out of the insulative housing;
wherein a gap is formed between the insulative housing and the box for sealant entering therein, and the insulative housing further includes a horizontal channel located in the bottom of the gap for the sealant entering therein and a vertical channel connecting the horizontal channel;
wherein said vertical channel is dimensioned to allow a needlelike injector tool with an injection hole thereof to be inserted into the vertical channel until said injection hole reaches the horizontal channel, and the sealant directly flows into the horizontal channel by the injection hole firstly, and then fills up said gap from bottom to top thereof so that a status of the sealant flowing into the gap without inducing bubbles is observed conveniently.

2. The signal transmission module as described in claim 1, wherein the vertical channel is formed solely in one of the insulative housing and box or by assembly of a first slot formed in the box and a second slot formed in the insulative housing.

3. The signal transmission module as described in claim 1, wherein the horizontal channel is formed solely in one of the insulative housing and box or by assembly of two separate parts formed in the box and the insulative housing respectively.

4. The signal transmission module as described in claim 1, wherein the gap is formed by a U-shaped slot opening upwardly, and the U-shaped slot could be defined in either the box or the insulative housing.

5. The signal transmission module as described in claim 4, wherein the U-shaped slot defines an opening, and the opening further recesses from a surface of the box or the insulative housing.

6. The signal transmission module as described in claim 1, wherein the vertical channel is located at one lateral side of the horizontal channel or at the middle thereof along the left-to-right direction.

7. A signal transmission module comprising:
a shell including a box and a mating portion protruding forwardly from the box, the box including a bottom wall, a front wall and a rear wall extending upwardly from respective front and rear edges of the bottom wall, a pair of sidewalls extending upwardly from left and right edges of the bottom wall, and a receiving cavity formed by the bottom wall, the front wall, the rear wall and the sidewalls;

a connector including an insulative housing extending in a left-to-right direction and a set of contacts retained in the insulative housing, each of the contacts includes a middle portion retained in the insulative housing, an engaging portion extending forwardly and passing through the box into the mating portion, and a tail portion extending upwardly and protruding out of the insulative housing;

wherein a gap is formed between the insulative housing and the box for sealant entering therein, and a horizontal channel located in the bottom of the gap for the sealant entering therein and a vertical channel connecting the horizontal channel, the horizontal channel communicating with the gap along the front-to-back direction;

wherein said vertical channel is dimensioned to allow a needlelike injector tool with an injection hole thereof to be inserted into the vertical channel until said injection hole reaches the horizontal channel, and the sealant directly flows into the horizontal channel through the injection hole firstly, and then fills up said gap from bottom to top thereof so that a status of the sealant flowing into the gap without inducing bubbles is observed conveniently.

8. The signal transmission module as described in claim 7, wherein a U-shaped slot is formed at an inner surface of the front wall of the box, and the U-shaped slot opens upwardly and passes through the front wall of the box.

9. The signal transmission module as described in claim 8, wherein the horizontal channel is formed at the bottom of the front surface of the insulative housing solely, and the vertical channel is formed at the front surface of the insulative housing solely or by assembly of a first slot formed in the box and a second slot formed in the insulative housing.

10. The signal transmission module as described in claim 9, wherein the insulative housing defines a set of receiving slots for retaining the middle portion of the contacts, and the horizontal channel locates under the receiving slots, and the vertical channel locates at one lateral side of the receiving slots along the left-to-right direction.

11. The signal transmission module as described in claim 7, wherein the front wall of the box defines a set of terminal slots passing through the front wall for receiving the contacts, and the terminal slots are arranged in rows and in columns along the vertical direction and the horizontal direction, and the front wall defines several recesses between every adjacent two rows or two columns of the contact slots.

12. A signal transmission module comprising:
a box forming a front wall with a plurality of terminal slots therethrough in a front-to-back direction, said terminal slots forming a matrix zone viewed in the front-to-back direction;

an electrical connector assembled to the box in an upside-down manner and including an insulative housing located behind the front wall, and a plurality of contacts retained in the housing, each of said contacts defining a contacting section extending forwardly into the corresponding terminal slot; and a gap formed between the front wall and the housing in said front-to-back direction around said matrix zone; wherein a downward channel is formed in at least one of said front wall and said housing around said gap and extends downward essentially below the matrix zone measured in a vertical direction perpendicular to said front-to-back direction wherein said downward channel is dimensioned to allow a sealant injector to be inserted into a bottom end of the downward channel for filling the gap upwardly instead of downwardly without inducing bubbles during filling the gap.

13. The signal transmission module as claimed in claim 12, wherein said downward channel is located by one side the matrix zone in a transverse direction perpendicular to both said front-to-back direction and said vertical direction.

14. The signal transmission module as claimed in claim 13, further including a transverse channel formed in at least one of said front wall and said housing around a bottom side of the gap to communicate and connect with a bottom end of said downward channel so as to allow said sealant to move therealong in a transverse direction perpendicular to said front-to-back direction and said vertical direction for efficiently filling the gap.

15. The signal transmission module as claimed in claim 14, wherein said transverse channel extends in said transverse direction.

16. The signal transmission module as claimed in claim 15, further including another downward channel located by the other side of the matrix zone in said transverse direction and communicating with the transverse channel so as to cooperate with the transverse channel and said downward channel to commonly form a U-shaped channel assembly to surround the matrix zone viewed in the front-to-back direction.

17. The signal transmission module as claimed in claim 14, further including an opening formed around a top side of the gap so as to cooperate with the gap and the transverse channel to form a Z like channel assembly in a cross-sectional view along said transverse direction.

18. The signal transmission module as claimed in claim 17, wherein said front wall forms a plurality of slits extending in the vertical direction to communicate with the opening in the vertical direction and to communicate with the gap in the front-to-back direction.

19. The signal transmission module as claimed in claim 12, wherein said downward channel extends in the vertical direction.

* * * * *